(12) United States Patent
Tadika et al.

(10) Patent No.: US 6,605,814 B1
(45) Date of Patent: Aug. 12, 2003

(54) APPARATUS FOR CURING RESIST

(75) Inventors: Nozomu Tadika, Kawasaki (JP);
Satoru Kuramochi, Kawasaki (JP);
Yoshiki Mimura, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/743,806

(22) PCT Filed: May 11, 2000

(86) PCT No.: PCT/JP00/03011
§ 371 (c)(1),
(2), (4) Date: Jan. 22, 2001

(87) PCT Pub. No.: WO00/72364
PCT Pub. Date: Nov. 30, 2000

(30) Foreign Application Priority Data

May 20, 1999 (JP) ............................................. 11-139359

(51) Int. Cl.⁷ .............................. A61N 5/00; G21K 5/00
(52) U.S. Cl. ................................. 250/492.2; 250/492.1; 250/443.1
(58) Field of Search ........................... 250/492.1, 492.2, 250/443.1

(56) References Cited

U.S. PATENT DOCUMENTS

| | | | |
|---|---|---|---|
| 5,071,485 A | * 12/1991 | Matthews et al. | 134/2 |
| 5,387,546 A | * 2/1995 | Maeda et al. | 437/174 |
| 5,426,558 A | * 6/1995 | Sherman | 361/234 |
| 5,591,269 A | * 1/1997 | Arami et al. | 118/723 R |
| 5,872,365 A | * 2/1999 | Goh et al. | 250/492.1 |
| 6,199,927 B1 | * 3/2001 | Shamlou et al. | 294/64.1 |
| 6,316,367 B1 | * 11/2001 | Sumnitsch | 438/716 |

FOREIGN PATENT DOCUMENTS

| | | |
|---|---|---|
| JP | 61-190936 | 8/1986 |
| JP | 3069111 | * 3/1991 |
| JP | 4-360512 | 12/1992 |
| JP | 5-47909 | 2/1993 |
| JP | 9-146283 | 6/1997 |
| JP | 10-135121 | 5/1998 |

\* cited by examiner

Primary Examiner—Bruce Anderson
(74) Attorney, Agent, or Firm—Nixon Peabody LLP; David S. Safran

(57) ABSTRACT

A resist curing device including a workpiece stage with a plate adapted to support a silicon wafer laid thereupon, a workpiece retention device that vacuum adsorbs the silicon wafer laid upon the plate, a light source unit that provides ultraviolet irradiation to cure resist applied to the silicon wafer, and a workpiece temperature control device that heats and/or cools the silicon wafer supported on the plate, where the plate has an expansion coefficient substantially similar to that of the silicon wafer.

2 Claims, 3 Drawing Sheets

APPARATUS FOR CURING RESIST

BACKGROUND OF THE INVENTION

1. Field of the Invention

The present invention concerns a resist curing device in which a resist applied to a silicon wafer is irradiated with light containing ultraviolet rays in the process of semiconductor integrated circuit manufacture.

2. Description of Related Art

In the production of semiconductor integrated circuits, silicon wafers are subjected to patterning, and a resist comprising photosensitive material and base polymer of novolak resin is uniformly applied to the surface of a silicon wafer as pretreatment to form various types of circuits. Photoresists are cured by irradiating silicon wafers with ultraviolet rays while heating the silicon wafer to enhance the heat resistance, chemical resistance and dry-etching resistance of resists.

First, a device such as a silicon wafer is held by vacuum adsorption as a workpiece on the surface of a workpiece stage that is provided with a temperature control means and a workpiece retention means for use in curing of such resists. The workpiece is vacuum adsorbed to uniformly and efficiently transmit heat from the workpiece stage to the workpiece while accurately controlling the temperature. The temperature of the silicon wafer is gradually raised from 100° C. to 200° C. while irradiating a resist applied to a silicon wafer with light containing ultraviolet rays from an ultraviolet lamp. The temperature is then lowered back to 100° C. following ultraviolet irradiation.

Outstanding resist layer characteristics in terms of heat resistance, chemical resistance and dry-etching resistance is obtained by so doing. For example, the heat resistance temperature of a resist whose heat resistance temperature is 140° C. can be raised to 250° C. by curing with ultraviolet irradiation.

In this manner, a silicon wafer workpiece is vacuum adsorbed on a workpiece stage to accurately control the temperature of the wafer during ultraviolet irradiation. However, the diameter of silicon wafers is large, ranging from 150 mm to 200 mm, and there are cases, depending on the conditions such as the type of resist or the layer thickness, in which such a large silicon wafer must be processed at a rapid heating rate of 1° C./second or more. Accordingly, a workpiece stage is formed from metal having good thermal conductivity such as copper to uniformly heat the entire broad surface of a silicon wafer while raising the temperature rapidly. Thus, a great difference in linear expansion coefficients exists between a silicon wafer comprising a single crystal of silicon whose linear expansion coefficient at 20° C. to 300° C. is $2.5 \times 10^{-6}$/K and a workpiece stage of copper whose linear expansion coefficient is 0.334/K.

Accordingly, when a silicon wafer is subjected to rapid rise and drop in temperature while vacuum adsorbed to a workpiece stage, the silicon wafer and workpiece stage rub together due to the great differences in the amount of linear expansion and the amount of heat shrinkage between the two, thereby creating radial rubbing blemishes on the backside of the silicon wafer.

Furthermore, the surface of a workpiece stage may be coated with ceramic to prevent direct contact between a silicon wafer and a metal workpiece stage in consideration of metal contamination of a silicon wafer. But even if the surface of a ceramic coating layer is adequately polished, it would remain rough compared to the surface of metal and many rubbing blemishes would form on the backside of the silicon wafer. The number of such rubbing blemishes could amount to 5000 to 15,000 depending on conditions, and their length could extend to the edges of a silicon wafer, reaching 0.5 mm.

The dislocation of the silicon single crystal could develop in the course of heating in subsequent steps if such rubbing blemishes develop on the backside of silicon wafers, and sleeves could develop in silicon wafers as such dislocations grow, resulting in production rejects. Furthermore, dust of shaved silicon powder that is created when such rubbing blemishes develop sticks to the backside of silicon wafers and is fed to the subsequent steps. For this reason, the wash in the subsequent washing process as well as the etching liquid in the etching process become contaminated with dust which is a cause of production rejects.

Thus, the primary purpose of the present invention is to provide a resist curing device in which rubbing blemishes do not develop on the backside of a silicon wafer even when a silicon wafer coated with a resist is vacuum adsorbed onto a workpiece stage and is subjected to curing processing by ultraviolet irradiation while being heated and cooled.

SUMMARY THE OF INVENTION

To attain such purposes, the present invention provides a resist curing device with a workpiece stage comprising a light source unit that carries out ultraviolet irradiation, a workpiece retention means that vacuum adsorbs a silicon wafer laid thereupon as a workpiece, and a workpiece temperature control means that heats and cools the workpiece, wherein the resist applied to the workpiece is subjected to ultraviolet irradiation and cured while the workpiece that is held on the surface of the workpiece stage is heated, the resist curing device further including a plate composed preferably of Si (silicon), $SiO_2$ (quartz), SiC (silicon carbide), or $Si_3N_4$ (silicon nitride) with through-holes to permit vacuum adsorption from the workpiece stage to act on the workpiece. The plate is interposed between the workpiece and the upper surface of the workpiece stage, and ultraviolet irradiation is carried out while the plate and workpiece are vacuum adsorbed on the workpiece stage by the workpiece retention means.

DETAILED DESCRIPTION OF THE PREFERRED EMBODIMENT

Figure 1:
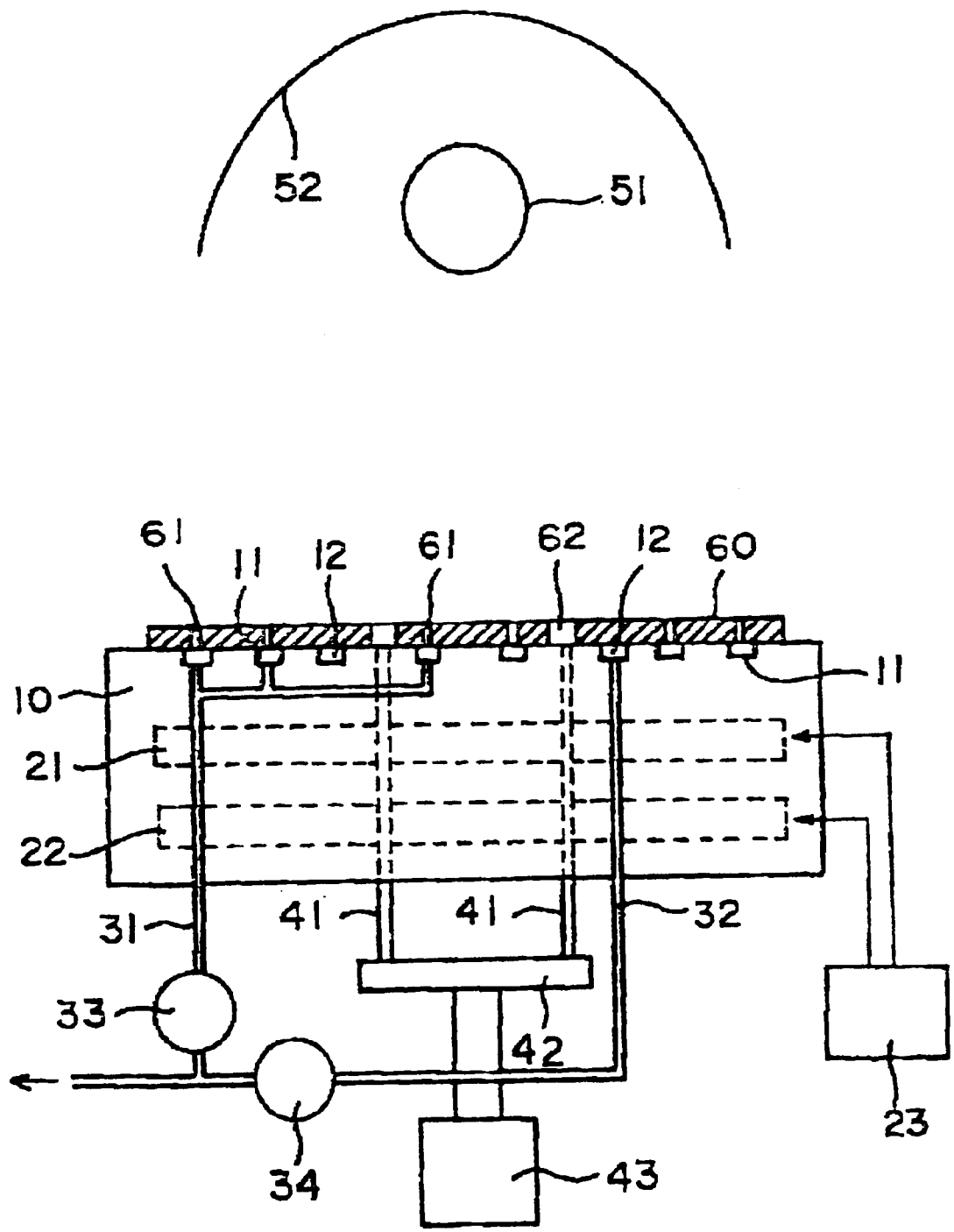
FIG. 1 is a schematic view of one embodiment of the present invention.

The preferred embodiment of the present invention is explained below based on the diagrams. FIG. 1 is a schematic cross-sectional view showing the resist curing device in accordance with one embodiment of the present invention. In FIG. 1, workpiece stage 10 which may be made of copper has good thermal conductivity. Second adsorption groove 12 is for vacuum adsorption of plate 60 discussed below that is laid on the upper surface of workpiece stage 10, while the first adsorption groove 11 is for vacuum adsorption of a device that constitutes the workpiece that is laid on plate 60, both the first adsorption groove 11 and the second adsorption groove 12 being formed on the upper surface of the workpiece stage 10. First adsorption groove 11 is connected to first vacuum pipe 31 while the second adsorption groove 12 is connected to second vacuum pipe 32. The first vacuum pipe 31 is connected to a depressurization device (not illustrated) via first electromagnetic valve 33, and the second vacuum pipe 32 is connected to a decompression device via second electromagnetic valve 34. Accordingly, plate 60 is vacuum adsorbed on the upper surface of workpiece stage 10 through actuation of second electromagnetic valve 34 while the workpiece is vacuum adsorbed on the upper surface of workpiece stage 10 via plate 60 through the actuation of first electromagnetic valve 33. The workpiece retention means may include these adsorption grooves 11, 12, vacuum pipes 31, 32, electromagnetic valves 33, 34, and the depressurization devices.

Heating means 21 may include a heater and cooling means 22 with water-cooling pipes through which cooling water circulates are disposed within workpiece stage 10. A signal from a sensor (not illustrated) that detects the workpiece temperature is input to controller 23, and heating means 21 as well as cooling means 22 are controlled by controller 23 based on this signal. The workpiece temperature control means may include heating/ cooling means 21, 22 as well as controller 23.

A plurality of transfer pins 41 that rise and fall through the workpiece stage in the vertical direction, for example, four pins, are disposed within workpiece stage 10. The lower edges of transfer pins 41 are held by ascending/descending plate 42, and transfer pins 41 complete ascent/descent actuation by actuator 43.

A light source unit may include ultraviolet lamp 51 and mirror 52 surrounding ultraviolet lamp 51 that is disposed on top of workpiece stage 10. Ultraviolet lamp 51 may be a high pressure mercury lamp having rated consumed power of 8 kW. The light containing ultraviolet rays that is radiated from ultraviolet lamp 51 is reflected off mirror 52 and irradiated onto a workpiece that is held on the upper surface of workpiece stage 10.

Figure 2:
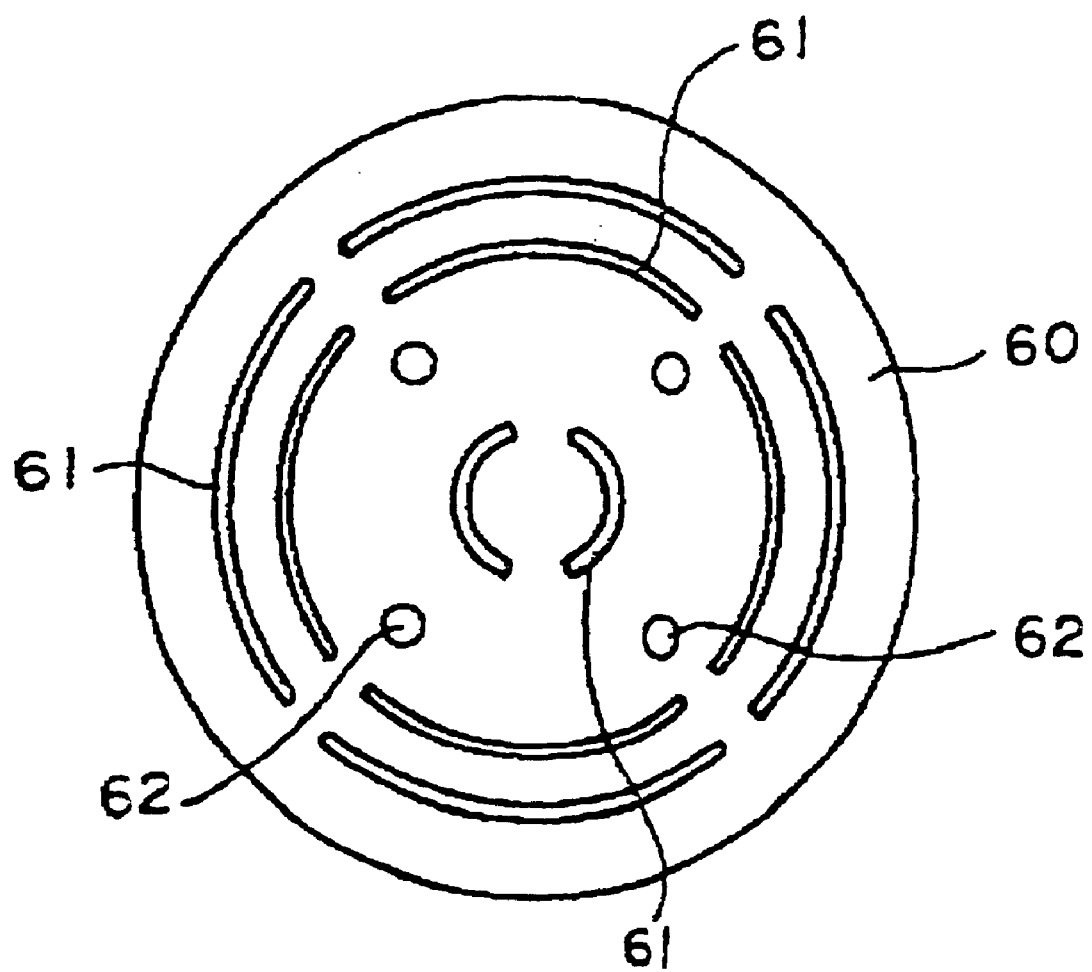
FIG. 2 is a top planar view of the plate in accordance with the present invention.

Plate 60 may be a thin round plate about 0.675 mm thick with arc-shaped through-holes 61 formed in concentric circles, as shown in FIG. 2. Through-holes 61 are aligned with first adsorption groove 11 formed on the upper surface of workpiece stage 10 when plate 60 is laid on the upper surface of workpiece stage 10. Accordingly, vacuum generated by a decompression device acts on the workpiece via first adsorption groove 11 and through-hole 61 to vacuum adsorb the workpiece on the upper surface of workpiece stage 10 via plate 60.

Four pin holes 62 aligned with the ascent/descent positions of transfer pins 41 are opened in plate 60. Accordingly, the workpiece on plate 60 can be raised/lowered by transfer pins 41 protruding from the upper surface of workpiece stage 10.

In accordance with one embodiment of the present invention, plate 60 may be composed of Si (silicon) which has the same linear expansion coefficient as that of silicon wafers made of single crystals of silicon, or from material whose linear expansion coefficient is similar, including $SiO_2$ (quartz), SiC (silicon carbide), and $Si_3N_4$ (silicon nitride).

The respective linear expansion coefficients at 20° C. to 300° C. are as follows.

Si $2.5 \times 10^{-6}$/K $SiO_2$ $0.5 \times 10^{-6}$/K

SiC $4.3 \times 10^{-6}$/K $Si_3N_4$ $3.4 \times 10^{-6}$/K

Figure 3:
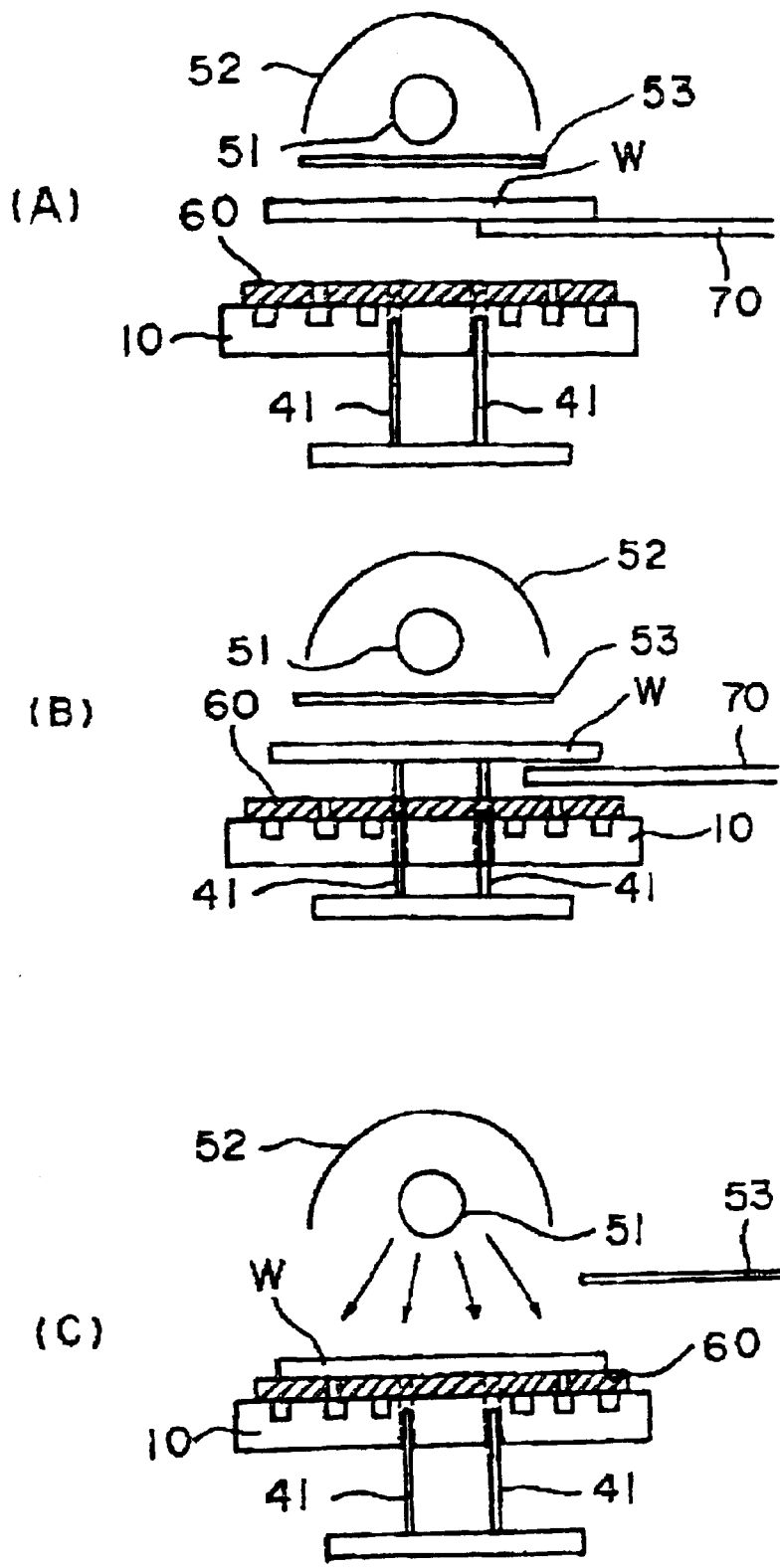
FIG. 3(A) shows a schematic view of the present invention of FIG. 1 being used in a step of the curing process.
FIG. 3(B) shows a schematic view of the present invention of FIG. 1 being used in another step of the curing process.
FIG. 3(C) shows a schematic view of the present invention of FIG. 1 being used in yet another step of the curing process.

The method of operating the resist curing device pursuant to the present invention is explained below based on FIGS. 3(A) to 3(C). First, workpiece W, a silicon wafer whose upper surface is coated with a resist, is held by chuck finger 70, as shown in FIG. 3 (A). Chuck finger 70 is moved forward to shift workpiece W to a predetermined position over workpiece stage 10. At this time, second electromagnetic valve 34 shown in FIG. 1 is actuated and plate 60 is vacuum adsorbed at a predetermined position on the upper surface of workpiece stage 10.

Next, transfer pins 41 are raised, workpiece W is received from chuck finger 70, and chuck finger 70 is retracted to its original position, as shown in FIG. 3 (B). Then, transfer pins 41 are lowered to set workpiece W on plate 60, as shown in FIG. 3 (C). Next, vacuum adsorption of workpiece W on the upper surface of workpiece stage 10 via plate 60 can be completed by actuating first electromagnetic valve 33 shown in FIG. 1. Specifically, workpiece W is brought into contact with plate 60 whose linear expansion coefficient is identical with, or similar to that of the workpiece W so that direct contact is not made with workpiece stage 10 made of copper with a linear expansion coefficient that is very different.

As the workpiece is held at a predetermined position, heating means 21 is actuated and the temperature of workpiece W is raised to 100° C., for example, after which shutter 53 between ultraviolet lamp 51 and workpiece stage 10 is opened to irradiate the resist applied on the upper surface of workpiece W with light containing ultraviolet rays. In addition, the temperature of workpiece W can be raised at a predetermined heating rate from 100° C. to 200° C., for example. Shutter 53 is then closed to halt ultraviolet irradiation, cooling means 22 is actuated to lower the temperature of workpiece W to 100° C. and curing processing is completed. When curing processing is completed, first electromagnetic valve 33 is closed to release vacuum adsorption of workpiece W, and transfer pins 41 are raised to lift up workpiece W from workpiece stage 10, whereupon it is received by chuck finger 70 and is conveyed to the next process.

In accordance with the present embodiment, workpiece W, plate 60 and workpiece stage 10 undergo thermal expansion and thermal shrinkage as a function of their respective linear expansion coefficients in response to the aforementioned heating and cooling. However, in accordance with the present invention, the workpiece W does not make contact with workpiece stage 10 whose thermal expansion and thermal shrinkage differ greatly. Rather, it makes contact only with plate 60 whose thermal expansion and heat shrinkage are identical or similar. Consequently, rubbing does not develop between workpiece W and plate 60 so that the backside of workpiece W does not develop radial rubbing blemishes. Accordingly, dust is not generated and the production rejects in subsequent processes attributable to dust can be avoided.

Furthermore, the workpiece W made of a single crystal of silicon does not suffer metal contamination since plate 60 in contact with workpiece W, is made of silicon or silicon compounds.

As explained above, the present invention concerns a resist curing device with a workpiece stage comprising a workpiece retention means that vacuum adsorbs a silicon wafer as a workpiece, and a workpiece temperature control means that heats and cools the workpiece, along with a plate composed of material having expansion coefficient similar to the workpiece such as Si, $SiO_2$, SiC, or $Si_3N_4$ with through-holes to permit vacuum adsorption from the workpiece stage to act on the workpiece. The backside of the workpiece does not develop rubbing blemishes as the resist applied to the workpiece is irradiated from a light source unit by ultraviolet rays while the plate and workpiece are vacuum adsorbed on the workpiece stage via the workpiece retention means.

As explained above, the present invention can be used as a resist curing device to cure resists applied to silicon wafers by irradiating them with light containing ultraviolet rays in the process of producing semiconductor integrated circuits.

We claim:

1. A resist curing device comprising:
   a workpiece stage having pin holes and a workpiece transfer pin within each pin hole for ascending/descending transport of a silicon wafer;
   a separate, removable plate placed upon an upper surface of the workpiece stage which is composed of a silicon-based material and supports a silicon wafer laid thereon;
   a workpiece retention device that vacuum adsorbs the silicon wafer laid on the plate;
   a light source unit that provides ultraviolet irradiation to cure a resist applied to the silicon wafer; and
   a workpiece temperature control device that at least one of heats and cools the silicon wafer supported on the plate;
   wherein the plate has an expansion coefficient substantially similar to that of the silicon wafer and further includes through-holes to allow the workpiece retention device to vacuum adsorb the silicon wafer through the plate, and a pin hole in the plate which is aligned with each said pin hole and transfer pin in the workpiece stage.

2. The resist curing device of claim 1, wherein the plate is made of material selected from a group consisting of Si (silicon), $SiO_2$ (quartz), SiC (silicon carbide), and $Si_3N_4$ (silicon nitride).

* * * * *